(12) United States Patent
Chan et al.

(10) Patent No.: US 6,349,032 B1
(45) Date of Patent: Feb. 19, 2002

(54) ELECTRONIC CHIP PACKAGING

(75) Inventors: Benson Chan, Vestal; Richard R. Hall, Endwell; John H. Sherman, Lisle; Candido C. Tiberia, Endicott, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/244,300

(22) Filed: Feb. 3, 1999

(51) Int. Cl.7 .................................................. H05K 7/20
(52) U.S. Cl. ........................ 361/704; 361/710; 361/715; 257/718; 257/719; 257/727
(58) Field of Search ............................... 165/80.2, 80.3, 165/185; 174/16.3; 361/704, 707, 709–710, 715, 754, 759, 807, 809; 257/712–713, 718–719, 726–727

(56) References Cited

U.S. PATENT DOCUMENTS

| | | | |
|---|---|---|---|
| 4,521,829 A | | 6/1985 | Wessely |
| 5,305,185 A | * | 4/1994 | Samarov et al. ............. 361/704 |
| 5,430,611 A | | 7/1995 | Patel et al. |
| 5,572,404 A | | 11/1996 | Layton et al. |
| 5,838,542 A | * | 11/1998 | Nelson et al. ............... 361/704 |
| 5,856,910 A | * | 1/1999 | Yurchenco et al. .......... 361/704 |
| 5,926,377 A | * | 7/1999 | Dolbear ....................... 361/704 |
| 5,965,937 A | * | 10/1999 | Chin et al. ................... 257/719 |

* cited by examiner

Primary Examiner—Gregory Thompson
(74) Attorney, Agent, or Firm—Salzman & Levy; Lawrence R. Fraley

(57) ABSTRACT

An electronic package contains a circuit card to which a chip carrier plate is attached via solder balls. A heat spreader plate, supporting a heat sink, is spring loaded against the semiconductor chip of the carrier plate by means of elastomeric disks disposed upon a spring retainer plate that is, itself, disposed adjacent the chip carrier plate. A plastic cover both protects and supports the heat sink and semiconductor chip. A retention latch is disposed between the cover plate and the spring retainer plate.

11 Claims, 8 Drawing Sheets

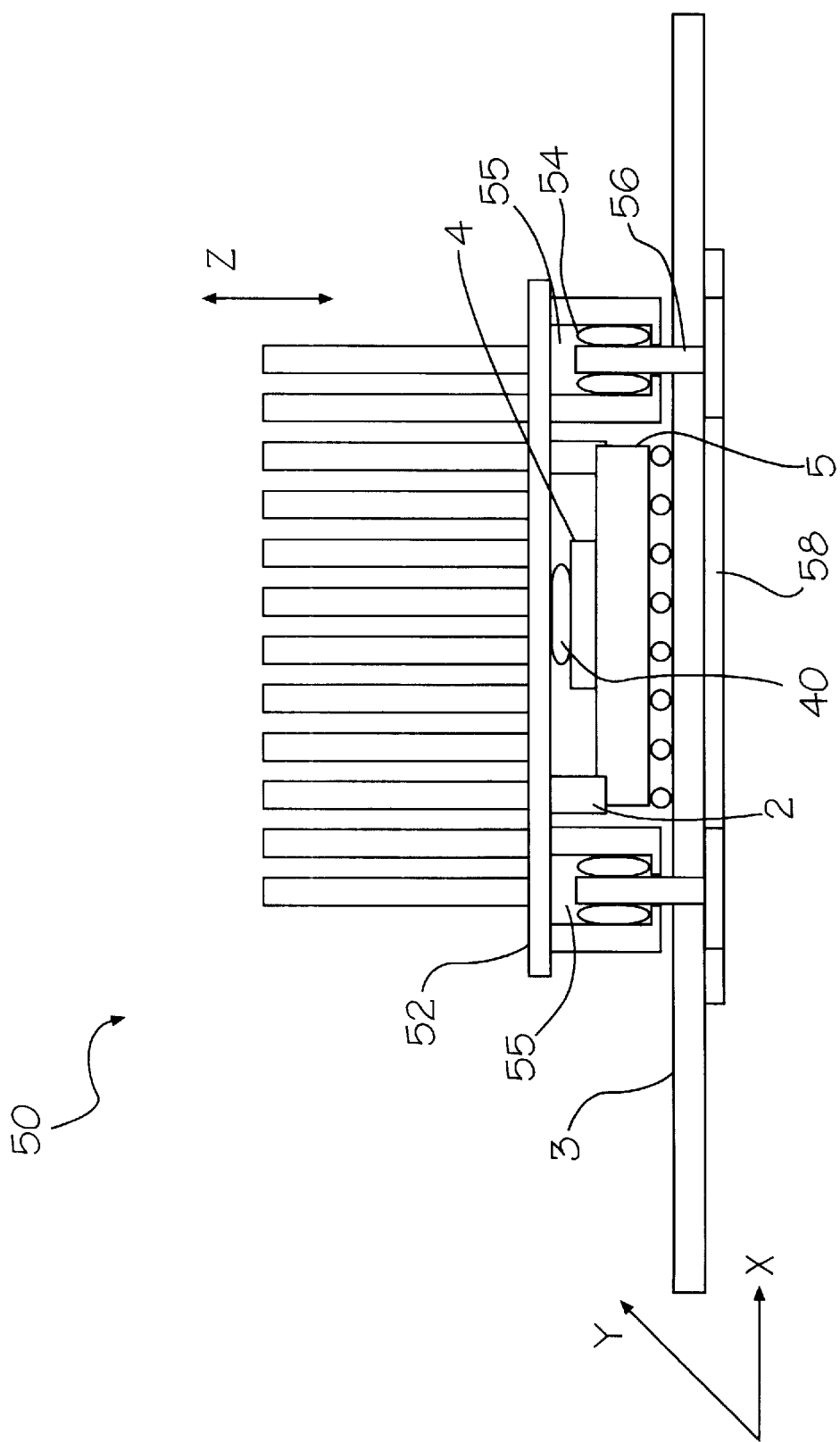

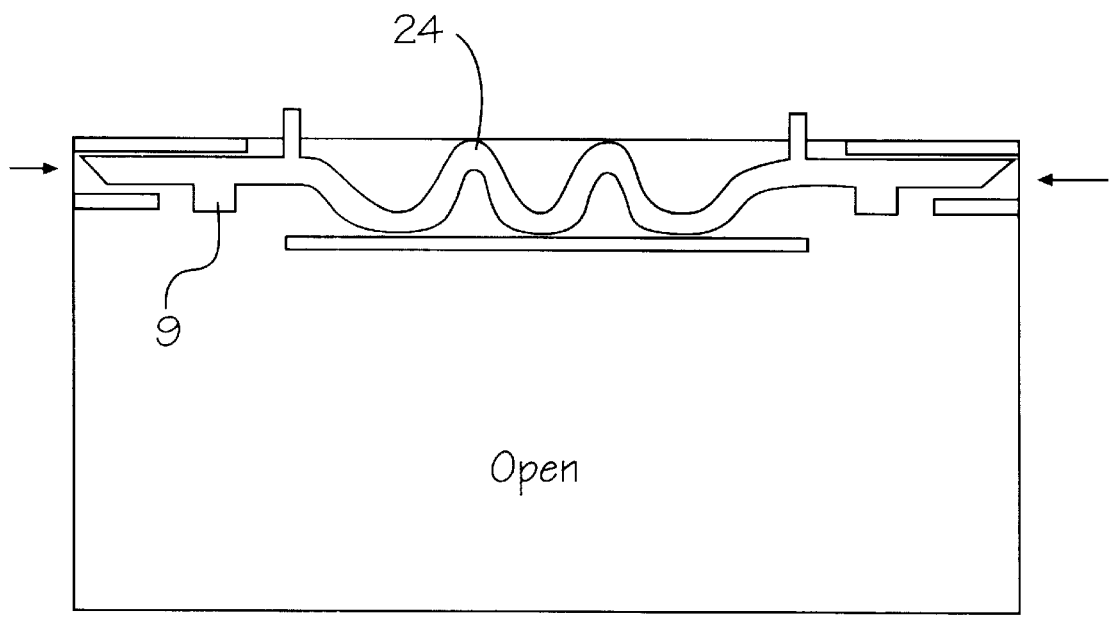
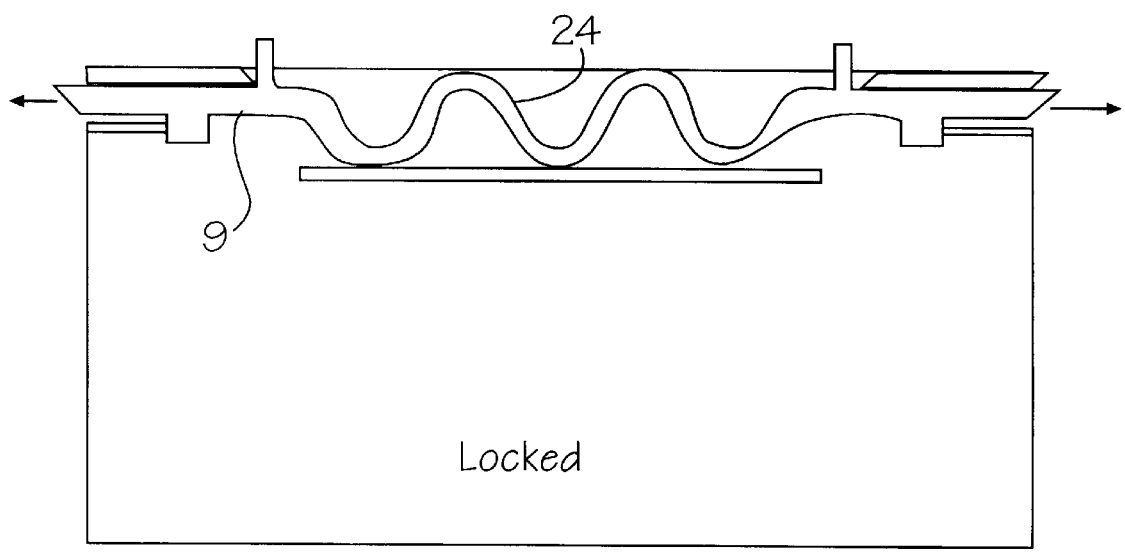
Figure 4

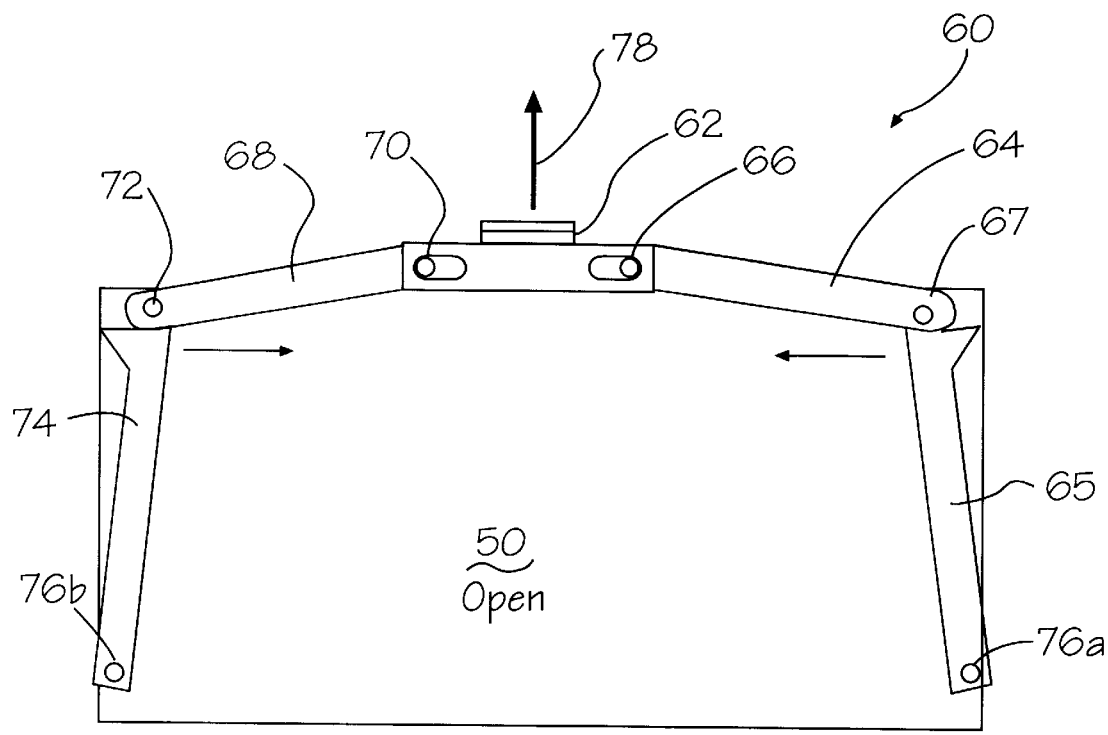
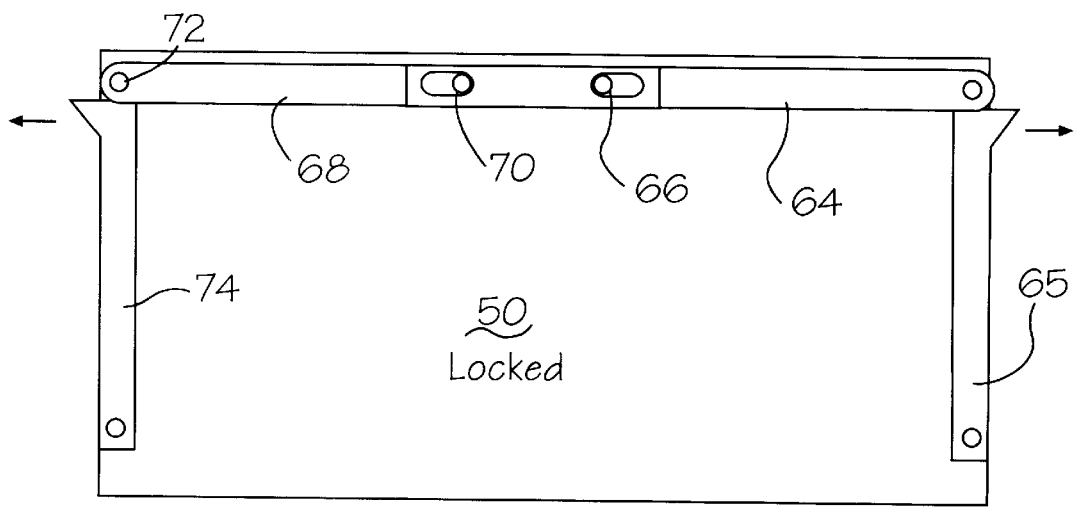
Figure 5

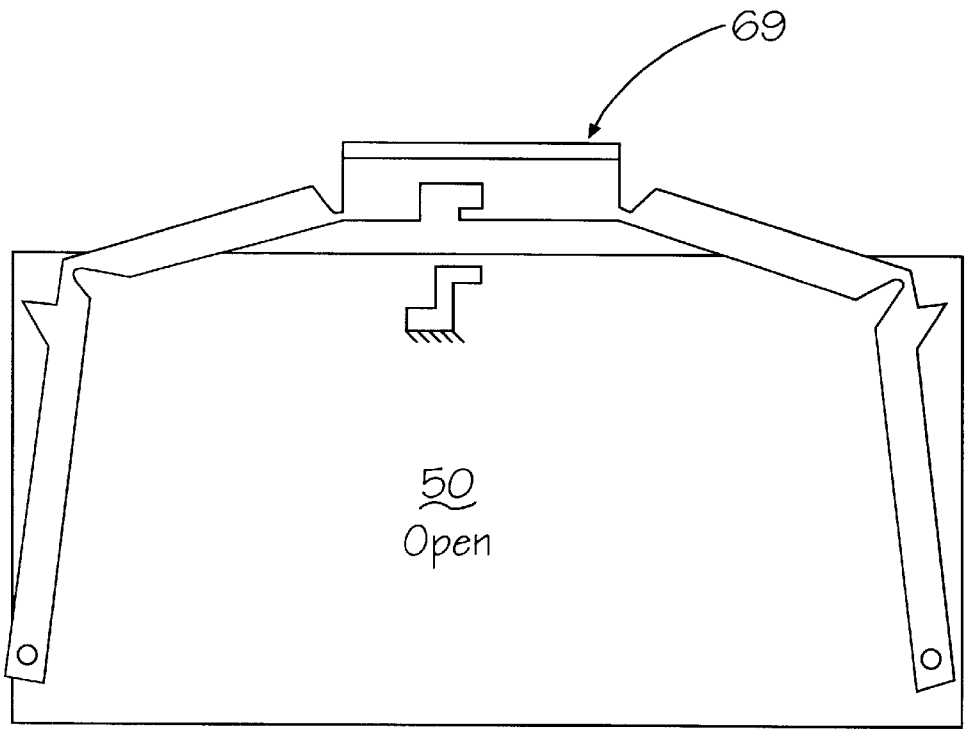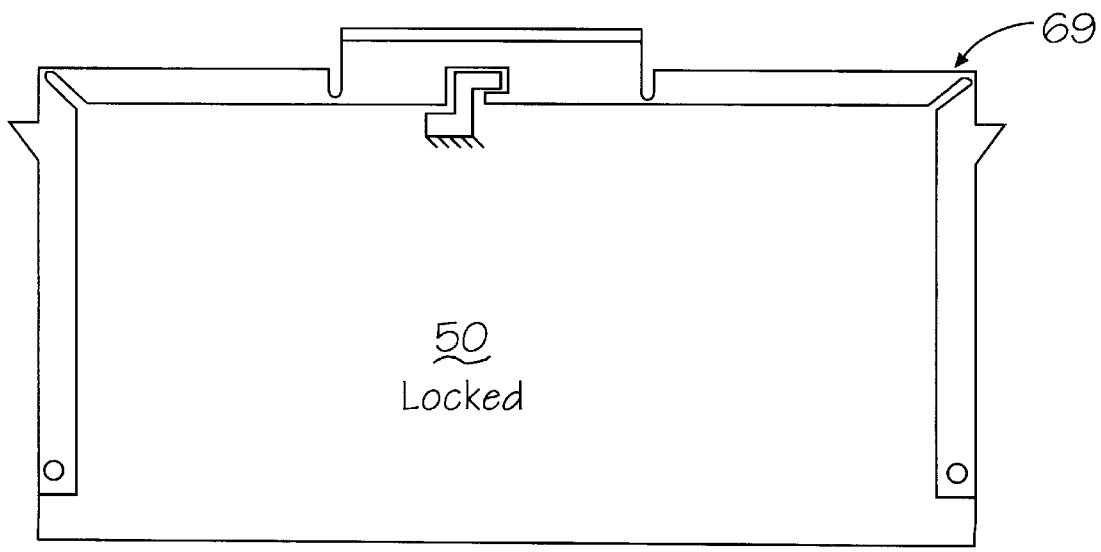
Figure 5a

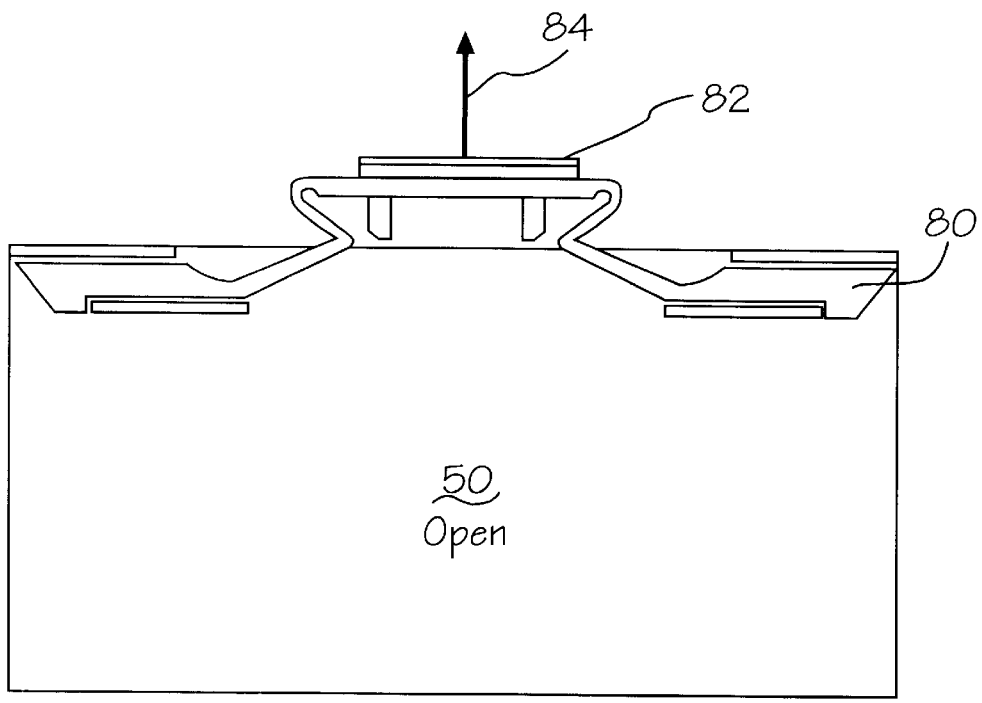
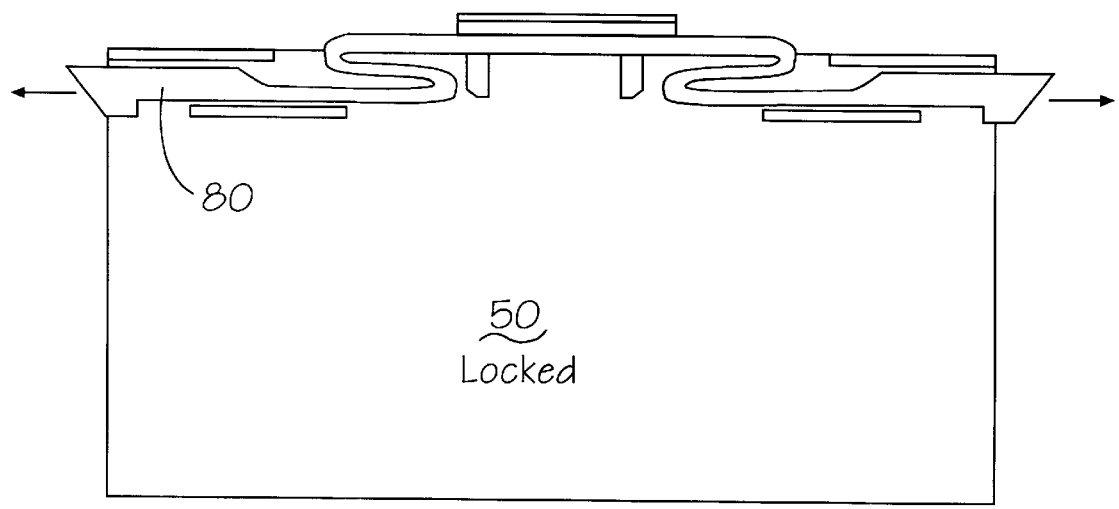
Figure 6

ELECTRONIC CHIP PACKAGING

FIELD OF THE INVENTION

The present invention relates to a processor chip for a computer and, more particularly, to a processor chip package that contains elastomeric elements for spring biasing an electronic chip to a heat sink with a controlled gap between the processor chip and the bottom surface of the heat sink.

BACKGROUND OF THE INVENTION

As computer chips become more sophisticated and powerful, it is well known that the requirement to dissipate the heat generated by the chips, also increases. An obvious and conventional solution has been to associate ever larger heat sinks with such powerful chips. In general, however, the larger the heat sink, the greater its weight. Such weight, when supported by the chip itself, produces significant stress on the relatively fragile electrical connections (e.g., an array of solder balls, columns or pads) between the chip and its mother board.

Mounting a processor chip to a mother board of a computer is often accomplished by means of a latching mechanism that biasly clamps the chip into engagement with a heat sink surface. This type of mounting package is taught or illustrated, for example, in U.S. Pat. Nos. 5,572,404 and 5,307,239, issued to Layton et al, and Tustaniwskyj et al respectively. It is necessary to maintain a positive bias between the chip and the heat sink in order for good thermal contact to be maintained. The aforementioned mounting package, while efficient, is expensive to manufacture.

In recent times, there has been increased market pressure to decrease the cost of personal computers in order to maintain sales and market share. One of the ways to accomplish this objective is to simplify the design of the computer and its components, thus reducing its cost.

One of the objects of the present invention is to provide a simplified mounting package for the processor chip of a personal computer, one that isolates the fragile solder balls of the chip from forces such as shock, for example. The inventive design places the chip very close to a heat spreader plate that carries a heat sink. The card carrying the chip is preloaded against a spreader plate with a pair of elastomer disks or other mechanical springs (e.g., steel springs) that provide a constant spring bias. A thin layer of thermal grease is placed between the processor chip and the heat spreader plate. In order to provide thermal reliability, a minimum gap must be maintained between the chip and the heat absorbing surface of the spreader plate. This consistent gap is achieved by a boss/standoff that is fabricated on the undersurface of the heat spreader plate.

The card carrying the chip is aligned by four guide posts extending from the heat spreader plate. The guide posts fit into a plastic cover plate. The plastic cover assembly permanently snaps into holes provided in the heat spreader plate. The cover supports two elongated retention latches that mate with slots in the spreader plate. Several latch embodiments can be utilized with the invention. The preferred embodiment comprises latches that are molded as one long piece with an integral center spring.

The aforementioned packaging design provides a simplified, low cost design that is consistent with the objectives of this invention. The assembly of the chip package is simple and can easily be disassembled to replace or rework its components. The processor chip package is designed to interconnect with a personal computer mother board via a card slot connector, such as a Slot 1 or Slot 2 connector.

DISCUSSION OF RELATED ART

In U.S. Pat. No. 4,521,829, issued to Wessely, on Jun. 4, 1985, for DEVICE FOR COOLING A PLURALITY OF INTEGRATED MODULES COMBINED ON A RIGID PRINTED CIRCUIT BOARD TO FORM LOGIC CARDS, a plurality of integrated modules is illustrated. The modules are spring mounted to a cooling plate above a supporting circuit board.

In U.S. Pat. No. 5,572,404, issued to Layton et al, on Nov. 5, 1996, for HEAT TRANSFER MODULE INCORPORATING LIQUID METAL SQUEEZED FROM A COMPLIANT BODY, a circular spring retainer is utilized to bias an integrated circuit against a heat sink.

In U.S. Pat. No. 5,430,611, issued to Patel et al, on Jul. 4, 1995, for SPRING-BIASED HEAT SINK ASSEMBLY FOR A PLURALITY OF INTEGRATED CIRCUITS ON A SUBSTRATE, a mounting package is illustrated that biasly attaches integrated circuits to a heat sink by a plurality of beam springs.

SUMMARY OF THE INVENTION

In accordance with the present invention, there is provided an electronic package for mounting a semiconductor chip to its circuit board. The electronic package contains a circuit card which supports an electronic chip. The semiconductor chip is attached to the chip carrier plate by an array of solder bumps or balls. A heat spreader plate supporting a heat sink is spring loaded against the semiconductor chip by means of elastomeric disks disposed upon a spring retainer plate that, itself, is disposed adjacent the chip carrier plate. A plastic cover both protects and supports the heat sink and the semiconductor chip. A retention latch is disposed between the cover plate and the spring retainer plate.

The electronic package can be utilized as a mount for a processor chip that plugs into a Slot 1, Slot 2 or other such connector on a personal computer mother board.

It is an object of this invention to provide an improved, low cost, electronic package for a semiconductor chip.

It is another object of this invention to provide a low cost, electronic package for a processor chip that mounts to a mother board in a personal computer.

It is still another object of this invention to provide an electronic package for a processor chip, used in conjunction with a heat sink, that isolates the fragile electrical connections of the chip from the weight of the heat sink and from other forces such as shock, for example.

It is yet another object of this invention to reduce the constant loading of the solder joints to improve reliability.

It is still another object of the invention to reduce the tolerance effects on the assembly.

BRIEF DESCRIPTION OF THE DRAWINGS

A complete understanding of the present invention may be obtained by reference to the accompanying drawings, when considered in conjunction with the subsequent detailed description, in which:

FIG. 3 is a cross sectional view of an alternate embodiment of the package in accordance with the present invention;

FIG. 4 is an enlarged, perspective view of the integral center spring latch shown in FIG. 1;

FIG. 5 is an enlarged, plan view of an alternate embodiment of the latch in accordance with the invention;

FIG. 5a is a plan view of an alternate embodiment of a latch having a living hinge;

FIG. 6 is an enlarged, plan view of another embodiment of the latch in accordance with the invention.

DESCRIPTION OF THE PREFERRED EMBODIMENT

Generally speaking, the invention features an electronic mounting package for computers and associated circuit boards. The electronic package contains a circuit card to which a chip carrier plate is attached. The chip is attached to the chip carrier plate by solder connections. A heat spreader plate, supporting a heat sink, is spring loaded against the semiconductor chip by means of elastomeric disks disposed upon a spring retainer plate. The spring retainer plate is disposed adjacent the chip carrier plate.

Figure 1:
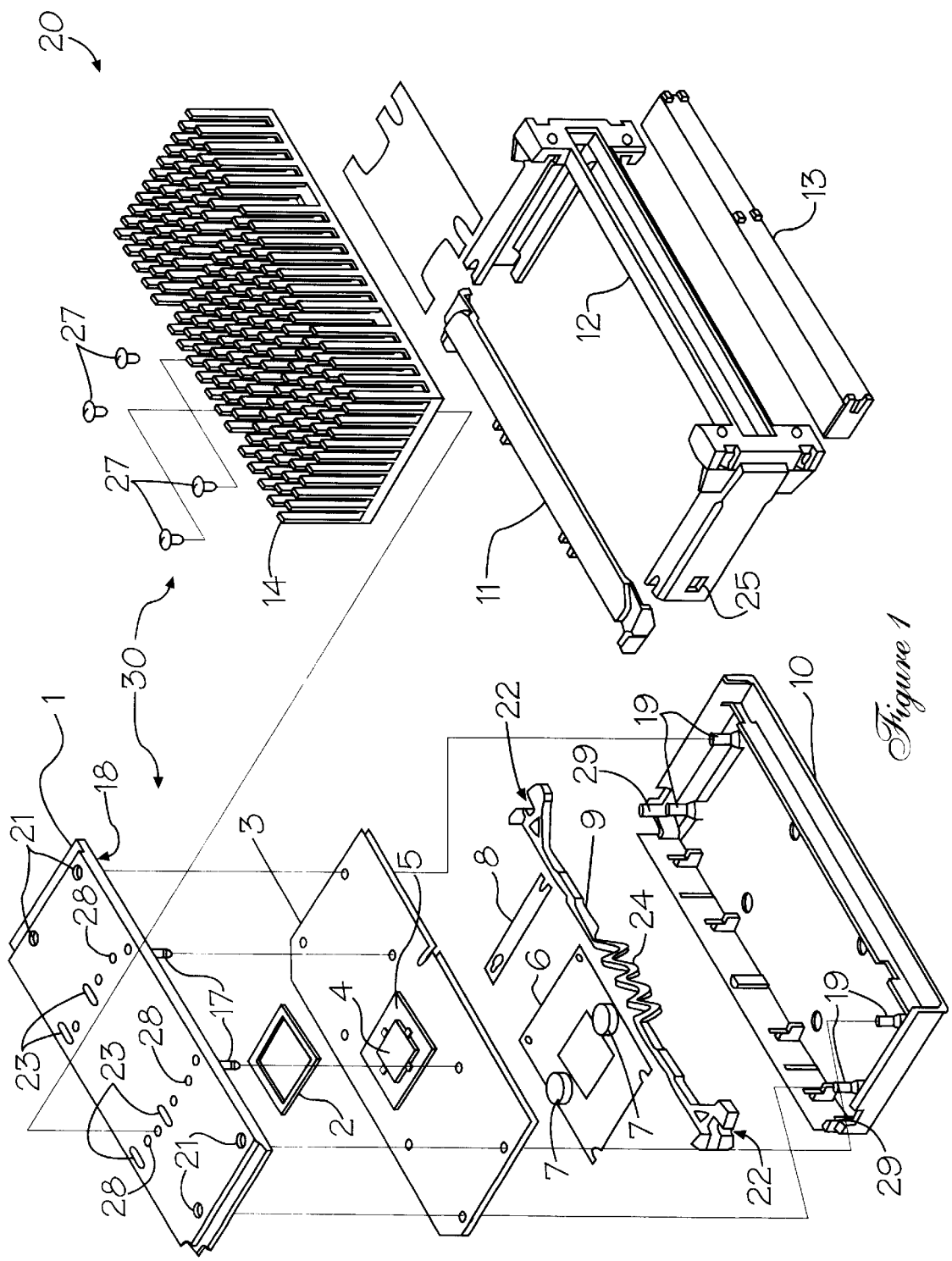
FIG. 1 illustrates an exploded, perspective view of the electronic mounting package of this invention.

Now referring to FIG. 1, the electronic mounting package 20 of this invention is illustrated in an exploded, perspective view. The inventive design places a semiconductor or processor chip 4 in contiguous thermal contact with a heat spreader plate 1, on which is supported a heat sink 14. A circuit card 3 carrying the chip 4 is preloaded against the spreader plate 1 with a pair of elastomer disks 7 that provide a constant spring bias. A thin layer of thermal grease, not shown, is placed between the processor chip 4 and the heat spreader plate 1. A standoff 2 maintains a consistent distance or gap between the chip 4 and the heat absorbing, undersurface 18 of the spreader plate 1 in order to provide thermal flow reliability. It should be understood that, although shown as a full-ring, independent component, standoff 2 may have a more minimal structure, such as only four or even two posts or rails. Such structure can be part of the undersurface 18 of heat spreader plate 1. In other words, a boss/standoff (not shown), that is fabricated on the undersurface 18 of the heat spreader plate 1, can also be provided to ensure consistent spacing between these components 1 and 4. The circuit card 3, carrying the chip 4, is biased against the heat spreader plate 1 by a spring retainer plate 6 supporting two elastomer disks 7. Disks 7 comprise a neoprene rubber or other resilient material, as shown.

Disks 7 are guided by internal guide posts 17. The heat spreader plate 1 is aligned by four guide posts 19 extending from a plastic cover 10. The plastic cover 10 permanently snaps into holes 21 provided in the heat spreader plate 1. The plastic cover 10 supports an elongated retention latch 9, retained in the cover plate 10 by retention feature 29 via slots 22. This embodiment illustrates a latch 9 that is molded as one long piece with an integral center spring 24. Since several latch embodiments can be utilized with the invention, as described in greater detail hereinbelow, the scope of the invention is not to be limited to the retention latch 9 shown here.

The processor chip 4 is shown mounted upon a ball grid array 5. The ball grid array 5 is disposed upon circuit card 3, as shown, and provides both electrical and mechanical connection between the card 3 and chip 4.

The heat sink 14 is mounted upon the heat spreader plate 1 by means of rivet screws 27 that mate with holes 28 in the heat spreader plate 1. Alternatively, heat sink 14 can be mounted to heat spreader plate 1 by means of retainer clips, not shown, attached to apertures 23.

The spring retainer plate 6 is locked into place by means of an elongated bar 8 that is keyed to one of the posts 17.

A connector guide 12 and connector 13 attach the chip assembly to the mother board (not shown) of a personal computer. A security or protective cover 11 prevents access to the assembly.

Figure 2:
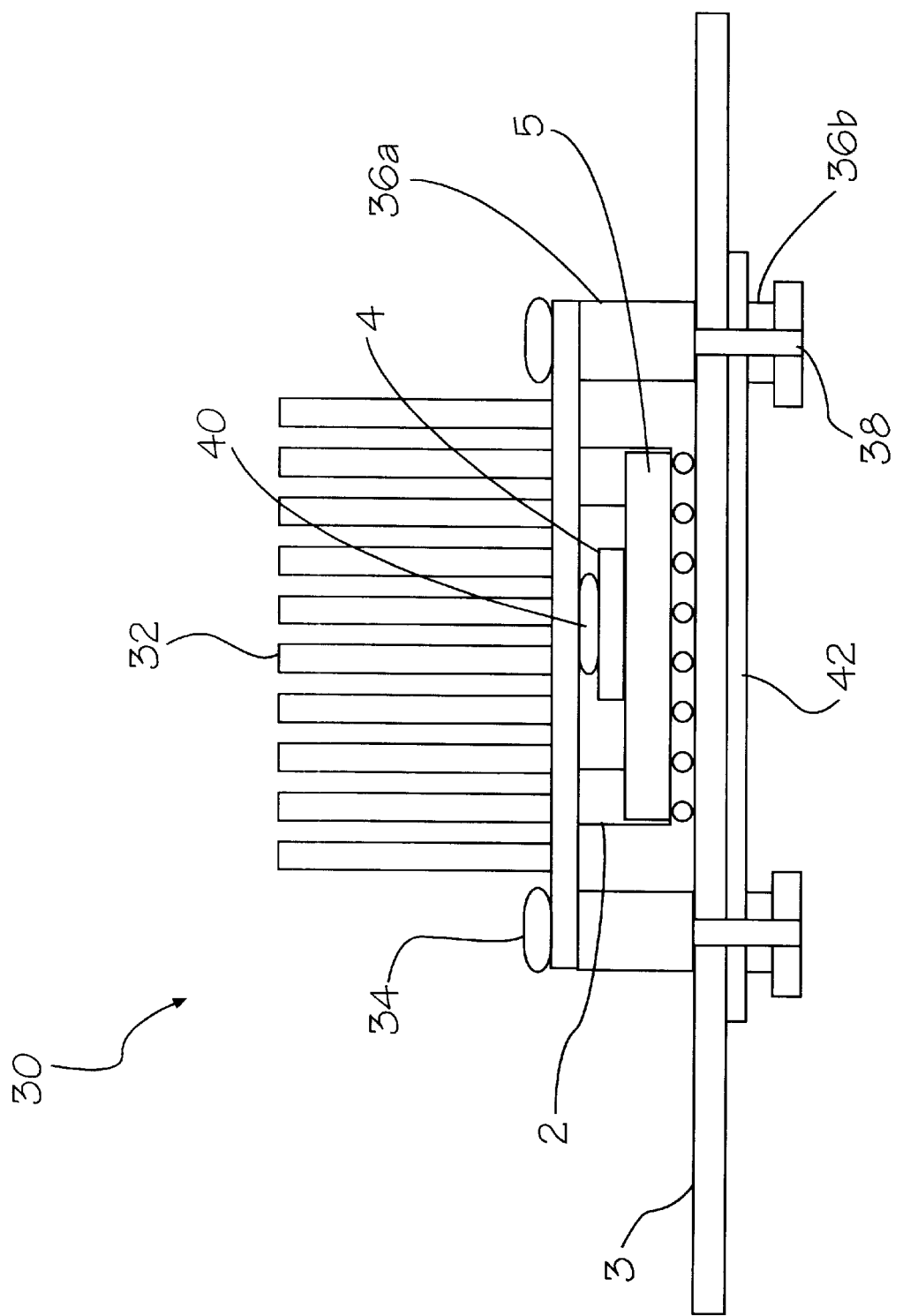
FIG. 2 is a cross sectional view of a cost-reduced version of an assembled electronic mounting package of the present invention representing a Second embodiment of FIG. 1.

Referring now to FIG. 2, there is shown a cross sectional view of an assembled electronic mounting package 30. Disposed on base plate 3 and connected by means of a solder ball grid array a circuit card module 5 is mounted supporting the processor chip 4. The heat sink 32 is connected to the assembly 30 by means of fasteners 34 atop damper springs. Damper springs are disposed between the base of the heat sink 32 and the upper surface of the circuit card 3. Damper springs are elastomeric in the preferred embodiment, but may be another spring force generating mechanism, the upper 36a and lower 36b damper springs being balanced to neutralize any loads and provide a zone of compliance for assembly tolerance considerations.

Four vertical guide posts 38 are used to seat the damper springs 36. The spacer/boss structures 2 are located above the module 5, offsetting the upper surface thereof from the heat sink 32. Finally, above the processor chip 4 itself is the thermal interface 40, which thermally connects the chip 4 to the heat sink 32. An optional support plate 42 helps support circuit card 3 in its loaded state.

Figure 2A:
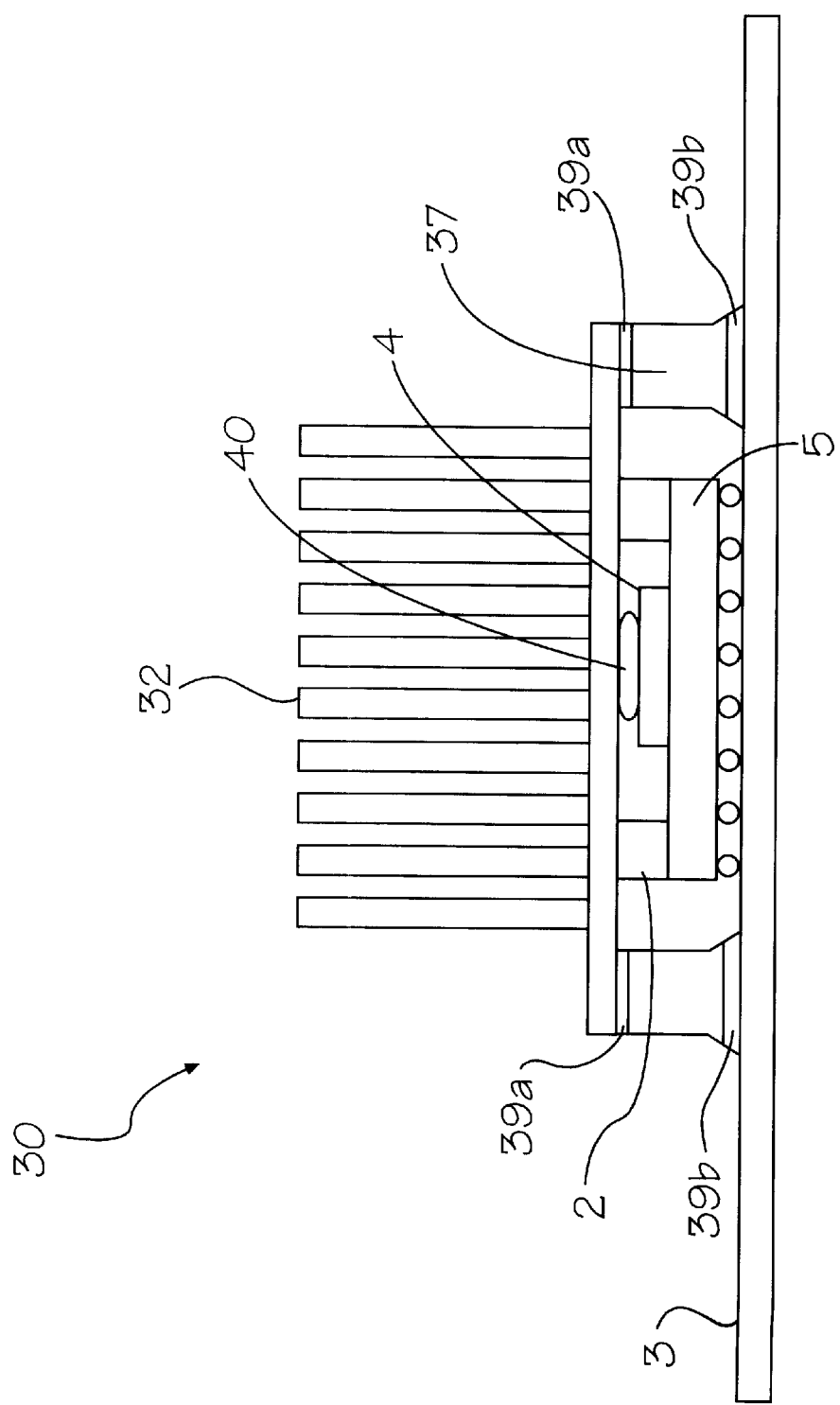
FIG. 2a is a cross sectional view of another embodiment of the package shown in FIG. 2.

Referring now to FIG. 2a, there is shown a cross sectional view of an assembled electronic mounting package 30 that is an alternate embodiment of the package 30 shown in FIG. 2. Once again, disposed on circuit card 3 is mounted the processor chip 4. The heat sink 32 is connected to the assembly 30 and support element 37 is disposed between the base of the heat sink 32 and the upper surface of the circuit card 3. In this embodiment vertical guide posts are not required. Support element or flanges 37 are attached directly to the circuit card 3 itself, in order to provide perimeter support and compensation for tolerance variability of the assembly's multiple components. Stress relief and component tolerance accumulation relief is achieved through the card attachment by adhesive filler 39b. Likewise, no support plate need be incorporated in this embodiment. The support element 37 may also be incorporated as part of the heat sink 32 as a single unit, eliminating one interface with filler material 39a. Depending on the application, the filler material 39a and 39b may be engineered elastomeric material, e.g., silicono, rubber, etc., solder, or adhesive for example.

Referring now to FIG. 3, there is shown a cross sectional view of an alternate embodiment of the package 50 in accordance with the present invention. Once again, disposed on circuit card 3 and electrically connected by means of a solder ball grid array module 5 on which is mounted processor chip 4. The heat sink 52 is connected to the assembly 50 by means of molded damper material 54. This molded damper material 54 is disposed about four vertical guide posts 56 that extend upwardly from the circuit card 3, providing isolation not only in the Z-axis direction, but also isolation from planar forces in the X-Y plane; it also provides stiffening to the assembly 50. Such stiffening is accomplished by connecting vertical guide posts 56 to a stiffening plate 58 through circuit card 3. During assembly, posts 56 are inserted in cavities 55 in heat sink 52. Molded damper material 54, such as adhesive, epoxy or rubber, for example, is then injected into the cavity 55, providing an in situ lock, negating assembly tolerance buildup.

The spacer/boss structures 2 are located above the module 5, offsetting the upper surface thereof from the heat sink 52. Finally, above the processor chip 4 itself is the thermal interface 40, which thermally connects the chip 4 to the heat sink 52.

Referring now to FIG. 4, there is shown an enlarged, perspective view of the integral center spring latch 9 shown in FIG. 1. As mentioned hereinabove, the plastic cover 10 (FIG. 1) supports the elongated retention latch 9 that is retained in the cover plate 10 by retention feature 29 and alignment pins 19 via slots 22, and which mate with retention holes 25 in the connector guide 12. Latch 9 is molded as one relatively long piece with an integral center spring 24 to reduce assembly complexity.

Referring now to FIG. 5, there is shown an enlarged, plan view of an alternate embodiment of latch 60. A handle 62 is pivotally connected to an intermediate member 64 by means of a pivot 66. Intermediate member 64 is joined to a retractable member 65 by another pivot 67. The opposite side of handle 62 is pivotally connected to a second intermediate member 68 by means of a second pivot 70. Likewise, a third pivot 72 connects second intermediate member 68 to second retractable member 74. Latch 60, including linkage pivots 66, 67, 72 and 70, is connected to card assembly 50 by means of mounting pivots 76*a* and 76*b*. In operation, the assembly 50 can be extracted from its housing by pulling handle 62 in the direction shown by arrow 78. A further embodiment of latch 60 can eliminate pivots 66, 67, 70 and 72 through the use of a living hinge 69, shown in FIG. 5*a*. This results in a single piece, molded part that reduces cost and complexity.

Referring now to FIG. 6, there is shown an enlarged, plan view of another embodiment of a latch 80 in accordance with the invention. In this embodiment, a handle 82 is shown disposed intermediate both ends of the latch 80. The assembly 50 can be extracted from its housing by pulling handle 82 in the direction shown by arrow 84. Of course, the assembly 50 can be reinserted into its housing by reversing the direction of the extraction force, thus pushing the assembly downwardly, as shown in this FIGURE.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An electronic mounting package, comprising:

a circuit card supporting an electronic chip disposed upon said circuit card;

a heat sink assembly including a heat spreader plate and a heat sink mounted thereon, said heat sink assembly being in operative thermal transfer with said electronic chip;

an elastomeric biasing mechanism disposed adjacent said circuit card for biasing said electronic chip into said operative thermal transfer with said heat sink assembly, said elastomeric biasing mechanism including at least two elastomeric spaced-apart disks disposed below and respectively extending outwardly below from oppositely disposed sides of said chip; and a thermal interface disposed between said heat sink assembly and said electronic chip, for creating and maintaining a substantially constant thermal gap distance therebetween.

2. The electronic mounting package in accordance with claim 1, wherein said two elastomeric spaced-apart disks are supported by a spring retainer plate.

3. The electronic mounting package in accordance with claim 1, wherein said thermal interface comprises a standoff.

4. The electronic mounting package in accordance with claim 1, wherein said elastomeric biasing mechanism further comprises spring dampers connected to said heat sink assembly for balancing forces generated by shock and vibration loads and by tolerance mismatches of components of said electronic mounting package.

5. The electronic mounting package in accordance with claim 1, wherein said spring dampers are disposed above and below said circuit card for supporting a load generated by said heat sink.

6. The electronic mounting package in accordance with claim 4, further comprising a stiffener plate attached to said circuit card and at least one guide post operatively connected to said stiffener plate and protruding through said circuit card, said elastomeric biasing mechanism being operatively connected to said guide post and to said heat sink.

7. An electronic mounting package, comprising:

a base plate;

a circuit card and heat sink assembly, said circuit card of said assembly supported by a ball grid array, and having an electronic chip mounted thereupon, and said heat sink assembly being in operative thermal transfer with said electronic chip mounted upon said circuit card;

a elastomeric biasing mechanism disposed adjacent said circuit card including at least two elastomeric spaced-apart disks disposed below and respectively extending outwardly below from opposite edges of said chip for biasing said electronic chip into operative thermal transfer with said heat sink, said elastomeric biasing mechanism further comprising spring dampers disposed between said heat sink and said base plate; and a thermal interface disposed between said heat sink and said electronic chip.

8. The electronic mounting package in accordance with claim 7, wherein said heat sink comprises a heat dissipative mechanism mounted upon a heat spreader plate that is in contiguous, operative thermal transfer with said electronic chip.

9. The electronic mounting package in accordance with claim 7, wherein said thermal interface comprises a standoff.

10. The electronic mounting package in accordance with claim 7, wherein said electronic chip is attached to said circuit card by soldered connections.

11. The electronic mounting package in accordance with claim 7, further comprising a stiffener plate attached to said circuit card and at least one guide post operatively connected to said stiffener plate and protruding through said circuit card, said elastomeric biasing mechanism being operatively connected to said guide post and to said heat sink.

* * * * *